United States Patent
Lenoble et al.

(10) Patent No.: US 8,168,504 B2
(45) Date of Patent: May 1, 2012

(54) INTEGRATED CIRCUIT COMPRISING A GRADUALLY DOPED BIPOLAR TRANSISTOR AND CORRESPONDING FABRICATION PROCESS

(75) Inventors: Damien Lenoble, Grenoble (FR); Thierry Schwartzmann, Versoud (FR); Laurence Boissonnet, Grenoble (FR)

(73) Assignee: STMicroelectronics SA, Montrouge (FR)

( * ) Notice: Subject to any disclaimer, the term of this patent is extended or adjusted under 35 U.S.C. 154(b) by 175 days.

(21) Appl. No.: 12/720,404

(22) Filed: Mar. 9, 2010

(65) Prior Publication Data
US 2010/0167488 A1   Jul. 1, 2010

Related U.S. Application Data

(62) Division of application No. 11/560,228, filed on Nov. 15, 2006, now Pat. No. 7,705,427.

(30) Foreign Application Priority Data
Nov. 16, 2005 (FR) .................................. 05 11621

(51) Int. Cl.
*H01L 21/331* (2006.01)
(52) U.S. Cl. ............... 438/311; 438/350; 257/E21.372
(58) Field of Classification Search .............. 438/311, 438/407; 257/E21.372
See application file for complete search history.

(56) References Cited

U.S. PATENT DOCUMENTS

| | | | |
|---|---|---|---|
| 4,749,660 A | 6/1988 | Short et al. ................... 438/766 |
| 5,358,883 A * | 10/1994 | Burger et al. ................. 438/339 |
| 5,982,022 A | 11/1999 | Violette ........................ 257/592 |
| 6,521,974 B1 | 2/2003 | Oda et al. ...................... 257/593 |
| 2001/0054746 A1 | 12/2001 | Yamada et al. ............... 257/565 |
| 2003/0122154 A1 | 7/2003 | Babcock et al. .............. 257/197 |

OTHER PUBLICATIONS

Avenier et al., "A Self-Aligned Vertical HBT for Thin SOI SiGeC BiCMOS", Bipolar/BICMOS Circuits and Technology Meeting, 2005, Proceedings of the Santa Barbara, CA, Oct. 9-11, 2005, pp. 128-131.

Mitrovic et al., "Review of SiGe HBTs on SOI", Solid State Electronics, Elsevier Science Publishers, vol. 49, No. 9, Sep. 2005, pp. 1556-1567.

Plummer et al., Silicon VLSI Technology Fundamentals:, Practice and Modeling, 2000, Prentice Hall, p. 17.

* cited by examiner

*Primary Examiner* — Chandra Chaudhari
(74) *Attorney, Agent, or Firm* — Allen, Dyer, Doppelt, Milbrath & Gilchrist, P.A.

(57) ABSTRACT

An integrated circuit includes a bipolar transistor comprising a substrate and a collector formed in the substrate. The collector includes a highly doped lateral zone, a very lightly doped central zone and a lightly doped intermediate zone located between the central zone and the lateral zone 4a of the collector. The substrate includes a lightly doped lateral zone and a highly doped central zone. The dopant species in the zone of the substrate are electrically inactive.

23 Claims, 3 Drawing Sheets

INTEGRATED CIRCUIT COMPRISING A GRADUALLY DOPED BIPOLAR TRANSISTOR AND CORRESPONDING FABRICATION PROCESS

RELATED APPLICATION

This application is a divisional of Ser. No. 11/560,228 filed Nov. 15, 2006 now U.S. Pat. No. 7,705,427, the entire disclosure of which is hereby incorporated herein by reference.

FIELD OF THE INVENTION

The present invention relates to integrated circuits, and more particularly, to laterally operating bipolar transistors comprising a gradually doped collector region.

BACKGROUND OF THE INVENTION

The production of bipolar transistors assembled with standard CMOS transistors within a semiconductor substrate or a silicon-on-insulator (SOI) substrate makes it possible at the present time to obtain integrated circuits of high electrical performance. Bipolar transistor architectures are preferably characterized at the present time by a double emitter/base/collector heterojunction of the polysilicon/carbon-containing SiGe alloy/silicon type. Bipolar transistors having such architectures may be used in the high-frequency field, especially for frequencies above 50 GHz.

The electrical performance of bipolar transistors is generally determined from the measurement of the transition frequency of the transistor as a function of the breakdown voltage of the emitter/collector junction. This breakdown voltage represents the maximum voltage above which the transistor passes into the avalanche regime.

Results obtained from these measurements show, for a given concentration of dopant species in the region of the collector, that when a bipolar transistor is used at high frequencies, it has a low breakdown voltage. Thus, a transistor has in particular, for frequencies between 50 GHz and 70 GHz, a low breakdown voltage of between 2 and 3 volts. Conversely, these results show that by lowering the concentration of dopant species in the region of the collector, a bipolar transistor having higher breakdown voltages is obtained, but this can be used only at low frequencies, especially below 30 GHz. Such a transistor may thus have, for frequencies between 20 GHz and 30 GHz, a higher breakdown voltage of between 6 and 7 volts. Such results are particularly described in the scientific article "*Vertical SiGe-base bipolar transistors on CMOS-compatible SOI substrate*", IBM, BCTM 2003.

It has thus been envisaged to produce bipolar transistors having an architecture for obtaining a compromise between operating at high frequencies and being able to withstand high voltages. One of these architectures includes in particular producing a bipolar transistor having a collector region that is not uniformly doped but gradually doped laterally. Specifically, it has been determined that such doping has an influence on the transition frequency and on the breakdown voltage of a bipolar transistor.

However, producing such an architecture has the drawback of using additional masks so as to localize, beneath the base of the transistor, the zone of the collector region that it is desired to dope laterally in a gradual manner. Thus, such a process has the drawback of imposing excessively severe alignment constraints during the photolithography steps. Furthermore, the transition frequencies and the breakdown voltage of a transistor vary according to the misalignment of the masks used during this process, making it particularly difficult to produce a gradually doped collector in a conventional manner. Such a process also incurs a cost increase in fabricating an integrated circuit, due to the use of additional masks.

SUMMARY OF THE INVENTION

In view of the foregoing, the object of the invention is to improve the production of bipolar transistors so as to obtain a compromise between a transistor used at high frequencies, especially above 50 GHz, which can withstand only low voltages, and a transistor withstanding high voltages but being able to be used only at low frequencies, especially below 30 GHz.

According to one embodiment, an integrated circuit comprises a bipolar transistor comprising a substrate and a collector formed in the substrate. The collector comprises a highly doped lateral zone, a very lightly doped central zone and a lightly doped intermediate zone located between the central zone and the lateral zone of the collector. The substrate comprises a lightly doped lateral zone and a highly doped central zone. The dopant species in the zone of the substrate may be electrically inactive.

Thus, what is obtained is a bipolar transistor having a vertical structure whose collector region is laterally doped in a gradual manner. In this way, an integrated circuit comprising a bipolar transistor is obtained that can be used at high frequencies, especially above 50 GHz, and that has a high breakdown voltage.

The intermediate zone of the collector may have a concentration of dopant species between $10^{16}$ atoms/cm$^3$ and $10^{19}$ atoms/cm$^3$.

The central zone of the collector may have a concentration of dopant species between $10^{15}$ atoms/cm$^3$ and $10^{17}$ atoms/cm$^3$ and the lateral zone of the collector may have a concentration of dopant species between $10^{20}$ and $10^{21}$ atoms/cm$^3$.

Preferably, the substrate used is a silicon-on-insulator (SOI) substrate, thereby making it possible for the dopant species to be made electrically inactive in the central zone of the substrate more effectively.

Advantageously, the collector of the transistor may be self-aligned with the base/emitter window, thereby making it possible to obtain a reproducible concentration profile of dopant species.

According to another aspect, a process fabricates an integrated circuit as described above comprising a step of implanting a dopant species in a lateral zone, a central zone and an intermediate zone of a collector of a bipolar transistor. The intermediate zone is located between the central zone and the lateral zone, and in a lateral zone and a central zone of a substrate of the bipolar transistor so that the collector comprises a highly doped lateral zone, a very lightly doped central zone and a lightly doped intermediate zone. This is so that the substrate comprises a lightly doped lateral zone and a highly doped central zone. The dopant species in the zone of the substrate is electrically inactive.

Such a process allows better control of the doping of the collector region beneath the base of a bipolar transistor. Advantageously, the angle of implantation during the step of implanting the dopant species in the collector is 0° so as to minimize the concentration of the dopant species in the central zone of the collector.

According to one mode of implementation, the step of implanting the dopant species includes at least the application of a layer, positioned above the collector, comprising of at least one material for absorbing the dopant species. Preferably, the layer includes at least one aperture for implanting the dopant species in the central zone of the substrate. The dopant species is electrically inactive in the zone.

BRIEF DESCRIPTION OF THE DRAWINGS

Other features and advantages of the invention will become apparent on examining the detailed description of the entirely non-limiting embodiments and modes of implementation and the appended drawings in which.

DETAILED DESCRIPTION OF THE PREFERRED EMBODIMENTS

Figure 1:
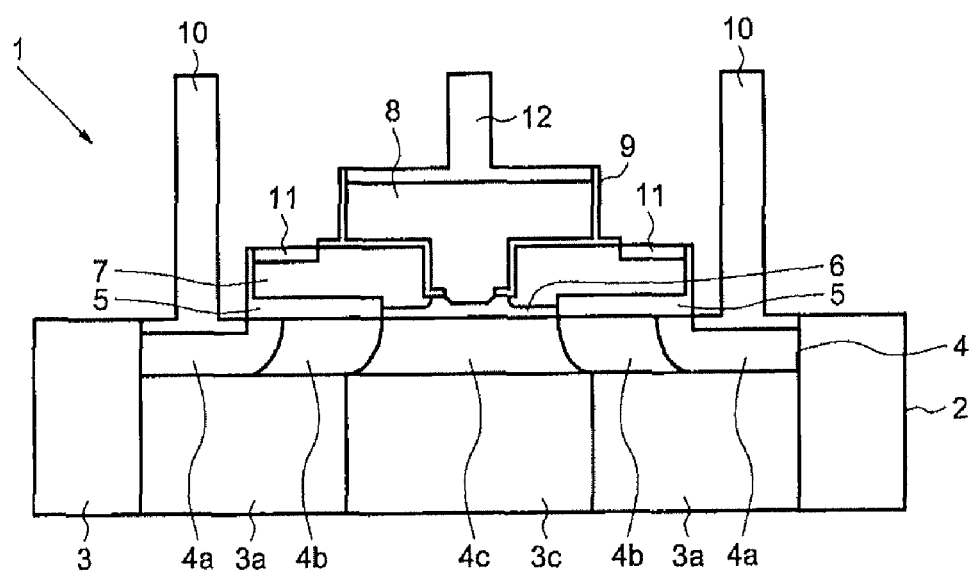
FIG. 1 illustrates schematically a bipolar transistor obtained according to one mode of implementation.

Illustrated in FIG. 1 is a bipolar transistor 1 of an integrated circuit comprising a substrate 2, which may be a silicon-on-insulator (SOI) substrate. The substrate 2 has a lower portion 3 comprising the insulator, partly surmounted by a layer 4 forming a collector which may be made of n-doped silicon, for example using arsenic or phosphorus.

The bipolar transistor 1 also includes on the upper surface of the collector 4 insulation layers 5 spaced apart by a layer 6 of $Si_xGe_{1-x}C_y$, having a percentage germanium content of generally between 10% and 40% and a percentage carbon content substantially less than 1%, for example around 0.05%. In other words, the insulator layers 5 cover the upper surface of the collector 4 so as to leave, in the middle of the surface, a window for the $Si_xGe_{1-x}C_y$ layer 6. The thickness of the layer 6 is typically from 50 to 70 nm.

The insulator layers 5 may have ends that extend vertically so as to form a well that partly supports thick layers 7, typically 50 to 70 nm in thickness, for example made of p-doped silicon using boron. The well formed by the insulator layers 5 is produced so that a portion of the layers 7 is in contact with the lateral zones of the $Si_xGe_{1-x}C_y$ layer 6. Such a stack of the layers 6 and 7 constitutes the base of the bipolar transistor 1.

The bipolar transistor 1 also includes an emitter region 8, which may be an arsenic-doped silicon layer and which surmounts the region of the base formed by the stack of layers 6 and 7. The emitter region 8 lies within a well 9 formed from an insulator, which may be TEOS oxide, which also covers the upper portion of the layers 7. The layer 8 forming the emitter region may have a thickness typically ranging from 80 to 150 nm.

The bipolar transistor 1 further includes metal studs 10, 11 and 12 made in the collector 4, in the base-forming layers 7 and in the emitter-forming layer 8, respectively.

The region of the collector 4 of the bipolar transistor 1 comprises a highly doped lateral zone 4a, a very lightly doped central zone 4c and a lightly doped intermediate zone 4b which is located between the lateral zone 4a and the central zone 4c. In other words, the collector 4 comprises three gradually doped zones, the lateral zone 4a being more highly doped than the intermediate zone 4b, which itself has a greater dopant species concentration than the central zone 4c.

As a result of the method of producing the bipolar transistor 1, the collector 4 is gradually doped over its entire length. Thus, on either side of the central zone 4c, the collector 4 comprises highly doped lateral zones 4a and lightly doped intermediate zones 4b.

Unlike the collector 4, the lower portion 3 of the substrate 2 comprises lightly doped lateral zones 3a and a highly doped central zone 3c. The dopant species in the zone 3c is electrically inactive. The lateral zones 3a lie beneath the lateral zones 4a and the intermediate zones 4b of the collector 4, and the central zone 3c lies beneath the central zone 4c. The lower portion 3 of the substrate 2 thus has zones that are gradually doped in the reverse manner to the zones of the collector 4.

Preferably, the lateral zone 4a has a dopant species concentration between $10^{20}$ atoms/cm$^3$ and $10^{21}$ atoms/cm$^3$. Preferably, the intermediate zone 4b has a dopant species concentration between $10^{16}$ atoms/cm$^3$ and $10^{19}$ atoms/cm$^3$ and the central zone 4c has a dopant species concentration between $10^{15}$ and $10^{17}$ atoms/cm$^3$.

Preferably, the lateral zone 3a of the substrate 2 has a dopant species concentration of less than $10^{15}$ atoms/cm$^3$ and the central zone 3c has a dopant species concentration of between $10^{15}$ and $10^{17}$ atoms/cm$^3$.

Figure 2:
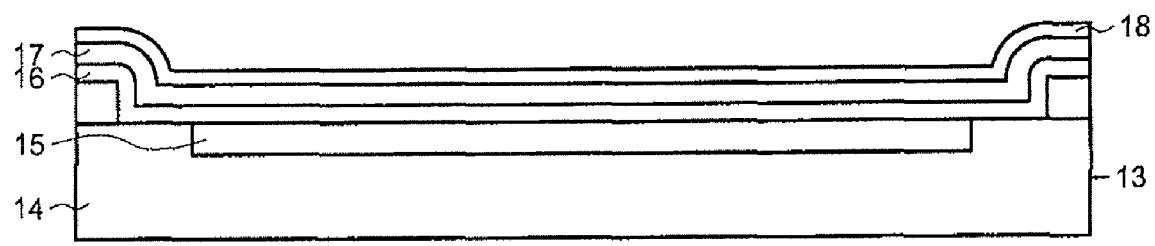
FIGS. 2 to 5 illustrate schematically the successive steps of one mode of implementing a process for fabricating a bipolar transistor comprising a gradually doped collector region according to the implementation.
Figure 3:
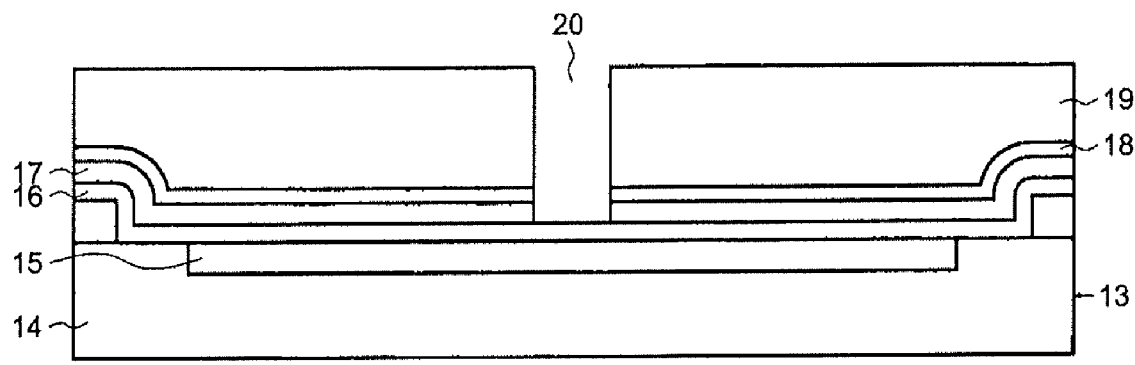

FIGS. 2 to 5 show the main steps of one mode of implementation for obtaining a bipolar transistor 1 as described above and as illustrated in FIG. 1. FIG. 2 shows a substrate 13, which may be a silicon-on-insulator (SOI) substrate, comprising a lower portion 14 that is partly surmounted by a layer 15 forming a collector. The lower portion 14 comprises the insulator, and the collector 15 may be made of silicon. Deposited in a conventional manner known per se on the substrate 13 is an insulator layer 16, for example made of TEOS oxide. The thickness of the insulating layer 16 is for example around 20 nm.

A layer 17 is then deposited on the insulating layer 16. The layer 17 is possibly made of polysilicon with a thickness of around 50 nm for example, usually called a polybase, and is intended to make contact with the base of the bipolar transistor 1. After this deposition, a layer 18 of silicon nitride ($Si_3N_4$) having the thickness of 50 nm is formed on the layer 17.

Next (FIG. 3), a zone 20 is formed, using a mask, in the nitride layer 18 corresponding to an emitter/base window located above the collector 15. Next, by way of a resist layer 19 corresponding to the mask, the nitride layer 18 undergoes plasma etching, stopping on the insulating layer 16, so as to remove a portion of the layer 17 so as to expose the zone 20.

Figure 4:
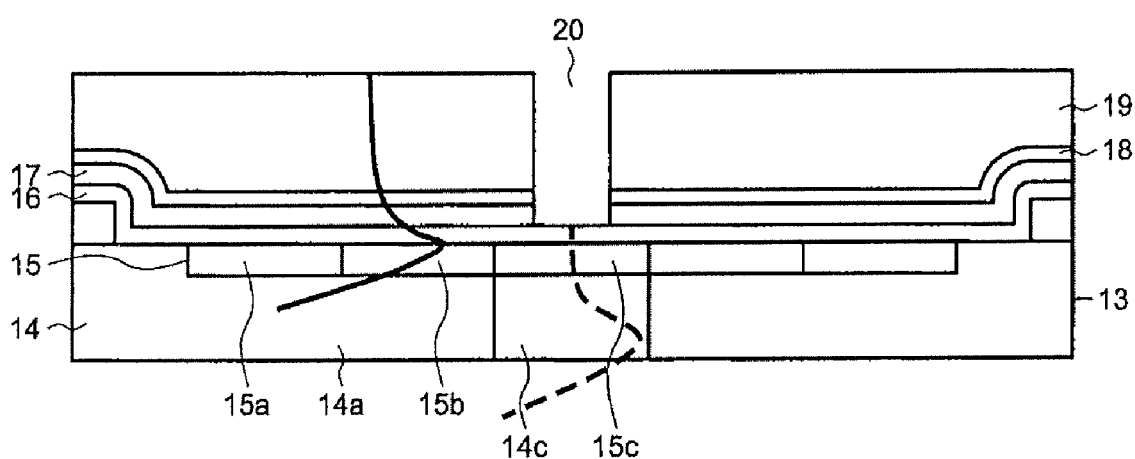

Next, while keeping the resist layer 19 present on the nitride layer 18, and having etched the latter, an n-type dopant species, for example phosphorus, is implanted so as to dope the collector 15. Such an implantation operation is carried out both through the resist layer 19 and through the aperture formed by the zone 20. The thickness of the resist layer 19 and the implantation energy are chosen so as to have a dopant species concentration profile in the collector 15 and in the lower portion 14 of the substrate 13, as shown in FIG. 4. Furthermore, the material of the layer 19 is chosen in such a way as to absorb the dopant species, so as to be able to obtain such a dopant species concentration profile.

Thus, after such an implantation, the region of the collector 15 comprises three gradually doped zones. In the zone 20, the collector 15 has a very lightly doped central zone 15c, while conversely the lower portion 14 of the substrate 13 has a highly doped central zone 14c located beneath the central zone 15c. Owing to the fact that the lower portion 14 comprises an insulator, the dopant species implanted in the central zone 14c are electrically inactivated. Advantageously, the angle of implantation during the process is 0°, thereby promoting the channeling of the ions implanted in the central zone 15c of the collector 15, and thus minimizing the concentration of the ions implanted in this zone.

In the zones of the collector 15 that are covered by the resist layer 19, the collector 15 has a lateral zone 15a having a higher dopant species concentration than the intermediate zone 15b located between the lateral zone 15a and the central zone 15c. Conversely, the lower portion 14 of the substrate 13 has a lateral zone 14a, located beneath the zones 15a and the zones 15b, which is more lightly doped than the central zone 14c.

Figure 5:
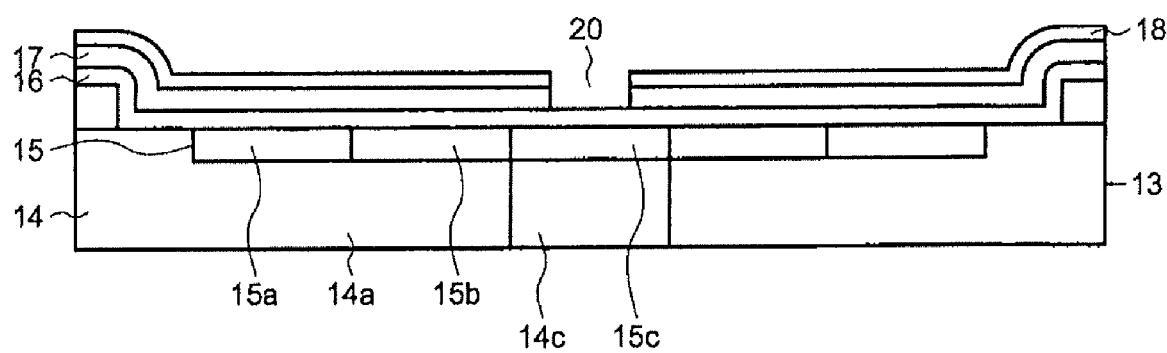

The implantation is thus carried out so as to obtain a gradual implantation within the collector 15 and within the lower portion 13 of the substrate 14. The dopant species concentration profile obtained in the collector 15 and in the lower portion 14 of the substrate 13 may be measured using a method known to those skilled in the art, for example a nanocapacitance method. The resist layer 19 is then removed by a conventional process (FIG. 5).

The bipolar transistor 1 as shown in FIG. 1 is then produced according to the conventional bipolar transistor fabrication steps known to those skilled in the art. Advantageously, what is obtained after this mode of implementation is a collector 15 self-aligned with the base/emitter window as there is no additional lithography step between the definition of the base/emitter window and the implantation of the collector as described above. Thus, the gradual lateral doping of the collector region is controlled and reproducible. A bipolar transistor is thus obtained that can be used at high frequencies and can withstand high voltages.

That which is claimed:

1. A method for making an integrated circuit comprising:
   forming a collector of a bipolar transistor in an upper layer of a substrate by implanting at least one dopant species to form a highly doped lateral zone, a very lightly doped central zone and a lightly doped intermediate zone between the central zone and the lateral zone; and
   as a result of forming the collector, forming a lower layer of the substrate underlying the collector to have a lightly doped lateral zone and a highly doped central zone, with dopant species in the central zone being electrically inactive.

2. A method according to claim 1, wherein implanting is performed at an angle of 0°.

3. A method according to claim 1, further comprising forming a dopant absorbing layer above the collector.

4. A method according to claim 3, wherein the dopant absorbing layer has at least one aperture to permit implanting therethrough.

5. A method according to claim 1, wherein the lightly doped intermediate zone has a dopant concentration within a range of $10^{16}$ atoms/cm$^3$ to $10^{19}$ atoms/cm$^3$.

6. A method according to claim 1, wherein the very lightly doped central zone has a dopant concentration within a range of $10^{15}$ atoms/cm$^3$ to $10^{17}$ atoms/cm$^3$.

7. A method according to claim 1, wherein the highly doped lateral zone has a dopant concentration within a range of $10^{20}$ to $10^{21}$ atoms/cm$^3$.

8. A method for making an integrated circuit comprising:
   forming a bipolar transistor comprising a collector in an upper layer of a substrate so that the collector has a highly doped lateral zone, a very lightly doped central zone and a lightly doped intermediate zone between the central zone and the lateral zone; and
   forming a lower layer of the substrate underlying the collector to have a lightly doped lateral zone and a highly doped central zone, with dopant in the central zone being electrically inactive.

9. A method according to claim 8, further comprising forming a dopant absorbing layer above the collector.

10. A method according to claim 9, wherein the dopant absorbing layer has at least one aperture to permit implanting therethrough.

11. A method according to claim 8, wherein the lightly doped intermediate zone has a dopant concentration within a range of $10^{16}$ atoms/cm$^3$ to $10^{19}$ atoms/cm$^3$.

12. A method according to claim 8, wherein the very lightly doped central zone has a dopant concentration within a range of $10^{15}$ atoms/cm$^3$ to $10^{17}$ atoms/cm$^3$.

13. A method according to claim 8, wherein the highly doped lateral zone has a dopant concentration within a range of $10^{20}$ to $10^{21}$ atoms/cm$^3$.

14. A method for making an integrated circuit comprising:
    providing a silicon-on-insulator substrate comprising an insulator layer and a silicon layer thereon; and
    forming a bipolar transistor comprising a collector in the silicon layer so that the collector has a highly doped lateral zone, a very lightly doped central zone and a lightly doped intermediate zone between the central zone and the lateral zone; and with the insulating layer underlying the collector having a lightly doped lateral zone and a highly doped central zone, with dopant in the central zone being electrically inactive.

15. A method according to claim 14, further comprising forming a dopant absorbing layer above the collector.

16. A method according to claim 15, wherein the dopant absorbing layer has at least one aperture to permit implanting therethrough.

17. A method according to claim 14, wherein the lightly doped intermediate zone has a dopant concentration within a range of $10^{16}$ atoms/cm$^3$ to $10^{19}$ atoms/cm$^3$.

18. A method according to claim 14, wherein the very lightly doped central zone has a dopant concentration within a range of $10^{15}$ atoms/cm$^3$ to $10^{17}$ atoms/cm$^3$.

19. A method according to claim 14, wherein the highly doped lateral zone has a dopant concentration within a range of $10^{20}$ to $10^{21}$ atoms/cm$^3$.

20. A method for making an integrated circuit comprising:
    providing a substrate comprising a lower layer and an upper layer thereon; and
    forming a bipolar transistor comprising a collector in the upper layer of the substrate, the collector comprising a lateral zone with a first dopant concentration, a central zone with a second dopant concentration and an intermediate zone with a third dopant concentration between the central zone and the lateral zone; and with the lower layer of the substrate comprising a lateral zone with a fourth dopant concentration and a central zone with a fifth dopant concentration, with dopant in the central zone being electrically inactive.

21. A method according to claim 20, wherein the third dopant concentration is within a range of $10^{16}$ atoms/cm$^3$ to $10^{19}$ atoms/cm$^3$.

22. A method according to claim 20, wherein the fifth dopant concentration is within a range of $10^{15}$ atoms/cm$^3$ to $10^{17}$ atoms/cm$^3$, and the fourth dopant concentration is within a range of $10^{20}$ to $10^{21}$ atoms/cm$^3$.

23. A method according to claim 20, wherein the substrate comprises a silicon-on-insulator (SOI) substrate, with the lower layer of the substrate being the insulator portion thereof.

* * * * *